United States Patent
Yang et al.

[19]

[11] Patent Number: 6,083,845
[45] Date of Patent: Jul. 4, 2000

[54] ETCHING METHOD

[75] Inventors: Chan-Lon Yang, Taipei; Tong-Yu Chen, Hsinchu, both of Taiwan

[73] Assignee: United Microelectronics Corp., Taiwan

[21] Appl. No.: 09/255,678

[22] Filed: Feb. 23, 1999

[51] Int. Cl.[7] .................................................. H01L 21/00
[52] U.S. Cl. .......................... 438/734; 438/723; 438/743
[58] Field of Search .................................... 438/723, 734, 438/743; 216/67, 79

[56] References Cited

U.S. PATENT DOCUMENTS

| 5,877,092 | 3/1999 | Lee ........................................... 438/734 |
| 5,906,948 | 5/1999 | Liu et al. ............................. 438/734 X |
| 5,942,446 | 8/1999 | Chen et al. ............................... 438/734 |

*Primary Examiner*—William Powell
*Attorney, Agent, or Firm*—Blakely Sokoloff Taylor & Zafman

[57] ABSTRACT

An etching method used in the high density plasma etching system to etch a silicon oxide dielectric layer to form openings of different depths. The method uses a mixture of $C_4H_8$, $CH_2F_2$, and Ar as an etching gas source to etch the silicon oxide dielectric layer, forming a plurality of openings of a first depth. A mixture of $C_4H_8$, CO, and Ar is used as an etching gas source to etch the silicon oxide dielectric layer exposed by the first opening, so that the opening is deepened to the second depth. Using a mixture of $C_4H_8$, $CH_2F_2$, CO, and Ar as the etching gas source, the silicon oxide dielectric layer exposed by the opening is etched, so that the openings are deepened to the third depth and the fourth depth.

16 Claims, 4 Drawing Sheets

ETCHING METHOD

BACKGROUND OF THE INVENTION

1. Field of Invention

The present invention relates to a method of manufacturing an integrated circuit. More particularly, the present invention relates to an etching method for making openings of different depths.

2. Description of Related Art

In the integrated circuit device, devices are often electrically connected via the formation of contacts. However, since the heights of the connected devices are not the same, the depths of the contacts are different. In case that a dynamic random access memory (DRAM), the substrate on which the DRAM is formed, the gate of a field effect transistor on the substrate, and a bit line all have different surface level, contacts connecting these regions are formed in the dielectric layer with different depths.

In the conventional method for forming contact openings of different depths in a dielectric layer, a mixture of fluoride-based methane group and Oxygen ($O_2$), Carbon Monoxide (CO) and Argon (Ar) is used as the etching formula to etch a silicon oxide dielectric layer. The etching process is performed in a magnetic enhanced reactive ion etching oxide etcher (MERIEOE). As the integration of a semiconductor increases, the aspect ratio of the contact gradually increases, so that such etching faces the problem of a poor etching selectivity, and an intractable contact profile.

In FIG. 1A, using DRAM as an example, the problems faced by etching contact openings of different depths in the prior art are illustrated and describe hereinafter. Referring to FIG. 1A, a substrate 100, a polysilicon layer over the substrate 100 or a gate 104, and a polysilicon layer 110 formed as a bit line have different surface levels in the figure. The silicon oxide dielectric layer 112 and the cape layer are etched to form openings 118, 114, and 116 to expose a source/drain region 106, a gate 104 and a polysilicon layer 110, respectively. By the above etching process, the etching process cannot be terminated at the surface of the substrate 100 or the gate 104 because the etching gas often has an insufficient selective ratio for the dielectric layer 112 and the substrate 100, or the dielectric layer 112 and the gate 104. Thus, the polysilicon layer 110, the substrate 100 or the gate 104 is damaged as shown by the dotted lines in FIG. 1A.

When the integration level further increases, the thickness of the dielectric layer 112 becomes thicker. The size of contact openings also diminishes. This obviously increases aspect ratio of the contact openings and greatly increases the etching difficulty. For example, when the thickness of the dielectric layer 112 is greater than 2.2 $\mu$m, and the size of the contact openings 114 and 116 is smaller than 0.4 82 m, the contact openings 114 and 116 having a high aspect ratio to cause an intractable profile for above etching process. FIG. 1B illustrates the etching step of contact openings 114 and 116 having high aspect ratios. The openings 116 and 118 having a larger depth are formed with a bowing profile. A problem with respect to the resistivity and reliability of the device is resulted by poor filling effect of the contact openings 114 and 116 with a metal layer.

SUMMARY OF THE INVENTION

The present invention provides an etching method, which is applicable to the process of etching and forming contact openings having high aspect ratios in a highly integrated circuit.

The etching method provided by the invention is used in a high-density plasma etching system to etch a dielectric layer of silicon oxide to form openings of different depths. The method uses a mixture of $C_4H_8$, $CH_2F_2$, and Ar as an etching gas source to etch the silicon oxide dielectric layer to form openings with a first depth. A mixture of $C_4H_8$, $CH_2F_2$, CO, and Ar is used as an etching gas source to deepen openings to a second depth and a third depth.

According to the present embodiment, the flow rate of the etching gas source for forming the openings with the first depth as described above is about 10 sccm to 20 sccm for $C_4H_8$, about 1 sccm to 50 sccm for $CH_2F_2$, and about 1 sccm to 500 sccm for Ar. The pressure of the high plasma density etching system is about 4 mtorr to 100 mtorr, bias is about 1000 W to 2000 W, power is about 500 W to 3000 W, roof temperature is about 150° C. to 300° C., ring temperature is about 150° C. to 400° C., and chiller temperature is about −20° C. to 20° C. The flow rate of the etching gas source for deepening the openings to the second and the third depth as described above is about 10 sccm to 20 sccm for $C_4H_8$, about 1 sccm to 50 sccm for $CH_2F_2$, about 1 sccm to 100 sccm for CO, and about 1 sccm to 500 sccm for Ar. The pressure of the high plasma density etching system is about 10 mtorr to 100 mtorr, bias is about 1000 W to 2000 W, power is about 500 W to 3000 W, roof temperature is about 150° C. to 300° C., ring temperature is about 150° C. to 400° C., and chiller temperature is about −20° C. to 20° C.

The invention provides an etching method, which is used to etch the dielectric layer of silicon oxide in a high density plasma etching system to form openings of different depths. The method uses a mixture of $C_4H_8$, $CH_2F_2$, and Ar as the etching gas source to etch the silicon oxide dielectric layer so that openings are formed with the first depth. A mixture of $C_4H_8$, CO, and Ar is used as the etching gas source to etch the silicon oxide dielectric layer which is exposed by the first depth opening, so that a part of the first depth openings with the first depth are deepened vertically to the second depth. A mixture of $C_4H_8$, $CH_2F_2$, CO, and Ar is used as the etching source to etch the dielectric layer of silicon oxide exposed by the second depth opening. This deepens openings to the third and the fourth depth.

According to the present embodiment, the flow rate of the etching gas source for forming a plurality of openings of the first depth as described above is about 10 sccm to 20 sccm for $C_4H_8$, about 1 sccm to 10 sccm for $CH_2F_2$, and about 1 sccm to 500 sccm for Ar. The pressure of the high density plasma etching system is about 4 mtorr to 100 mtorr, bias is about 1000 W to 2000 W, power is about 500 W to 3000 W, roof temperature is about 150° C. to 300° C., ring temperature is about 150° C. to 400° C., and chiller temperature is about −20° C. to 20° C. The flow rate of the etching gas source for vertically deepening the depth of the openings to the second and the third depth as described above is about 10 sccm to 20 sccm for $C_4H_8$, about 1 sccm to 100 sccm for CO, and about 100 sccm to 500 sccm for Ar. The pressure of the high density plasma etching system is about 4 mtorr to 1000 mtorr, bias is about 1000 W to 2000 W, power is about 500 W to 3000 W, roof temperature is about 150° C. to 300° C., ring temperature is about 150° C. to 400° C., and chiller temperature is about −20° C. to 20° C. The flow rate of the etching gas source for deepening the depth of openings to the third and the fourth depth as described above is about 10 sccm to 20 sccm for $C_4H_8$, about 1 sccm to 50 sccm for $CH_2F_2$, and about 1 sccm to 500 sccm for Ar. The pressure of the high density plasma etching system is about 4 mtorr to 100 mtorr, bias is about 1000 W to 2000 W, power is about 500 W to 3000 W, roof temperature is about 150°

C. to 300° C., ring temperature is about 150° C. to 400° C., and chiller temperature is about −20° C. to 20° C.

It is to be understood that both the foregoing general description and the following detailed descriptions are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
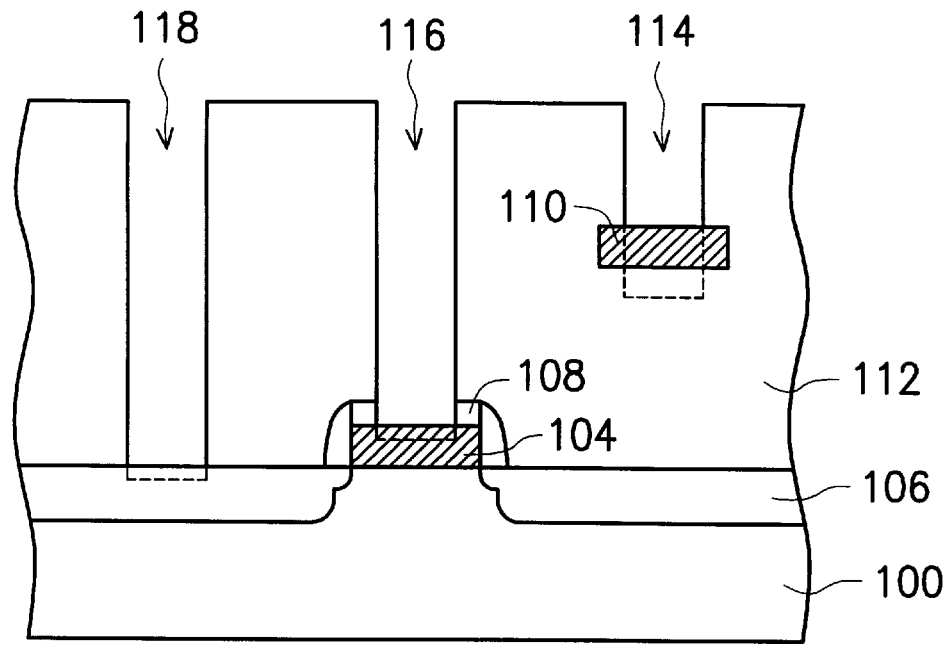
FIG. 1A is a schematic, cross-sectional diagram showing a conventional DRAM, in which the gate and the substrate surface undergo damage when etching contact openings of different depths.
Figure 1B:
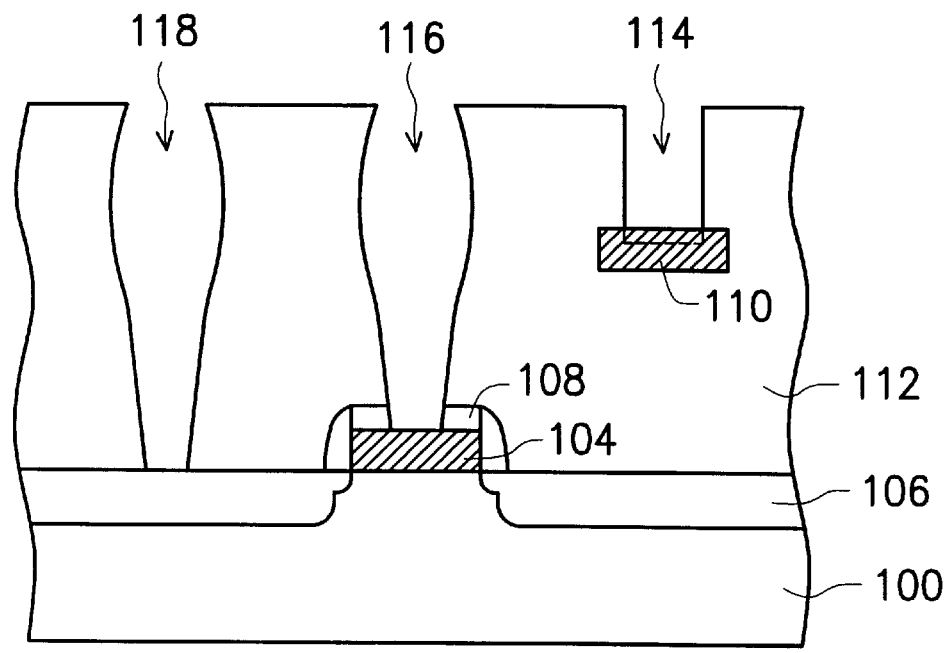
FIG. 1B is a schematic, cross-sectional diagram showing a conventional DRAM, in which the contact opening having a high aspect ratio have a bowed profile.

Reference will now be made in detail to the present preferred embodiments of the invention, examples of which are illustrated in the accompanying drawings. Wherever possible, the same reference numbers are used in the drawings and the description to refer to the same or like parts.

The invention provides an etching method that is used in a high density plasma etching system to etch a silicon oxide dielectric layer, so as to form openings of different depths. In the high density plasma etching system, since high density ions can be provided in a low pressure reaction chamber, openings are formed to have the advantage of a vertical etch profile. The etching method of the invention will be described in detail with reference to fabrication of contact openings of different depths in a DRAM.

Figure 2A:
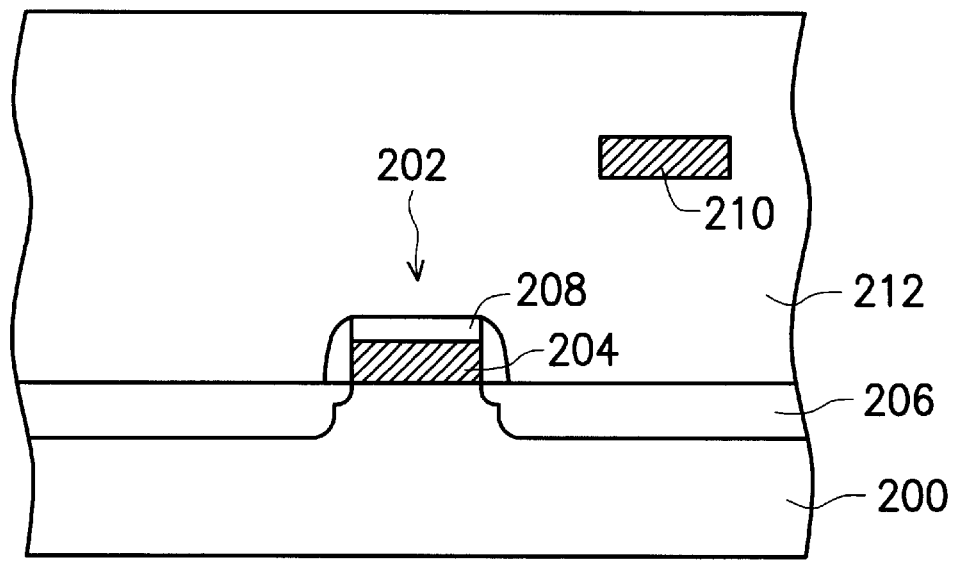
FIGS. 2A to 2D are schematic, cross-sectional diagrams showing the process flow for fabricating the contact openings of different depths in a DRAM according to a preferred embodiment of the invention.

Referring to FIG. 2A, a substrate 200 comprising a field effect transistor 202 thereon is provided. The field effect transistor 202 includes a gate 204 and a source/drain region 206. The gate 204 may be formed by a single polysilicon layer, or a policide comprising a polysilicon layer and a metal silicide layer. The top of the silicon oxide gate 204 is covered with a cap layer 208, the material of which includes, for example, silicon nitride or silicon oxide formed by chemical vapor deposition (CVD). The transistor 202 is covered by a silicon oxide dielectric layer 212. A polysilicon layer 210 is formed over the substrate 200 within the dielectric layer 212. The polysilicon layer 210 is functioned as a metal line such as a DRAM bit line, for example. In the invention, contact openings are formed in the silicon oxide dielectric layer 212 to expose the source/drain region 206, the gate 204 and the polysilicon layer 210. The high density plasma etching system is used to perform the etching process with different etching gas sources and etching conditions at different etching stages, so that contact openings of different depths are obtained.

Figure 2B:
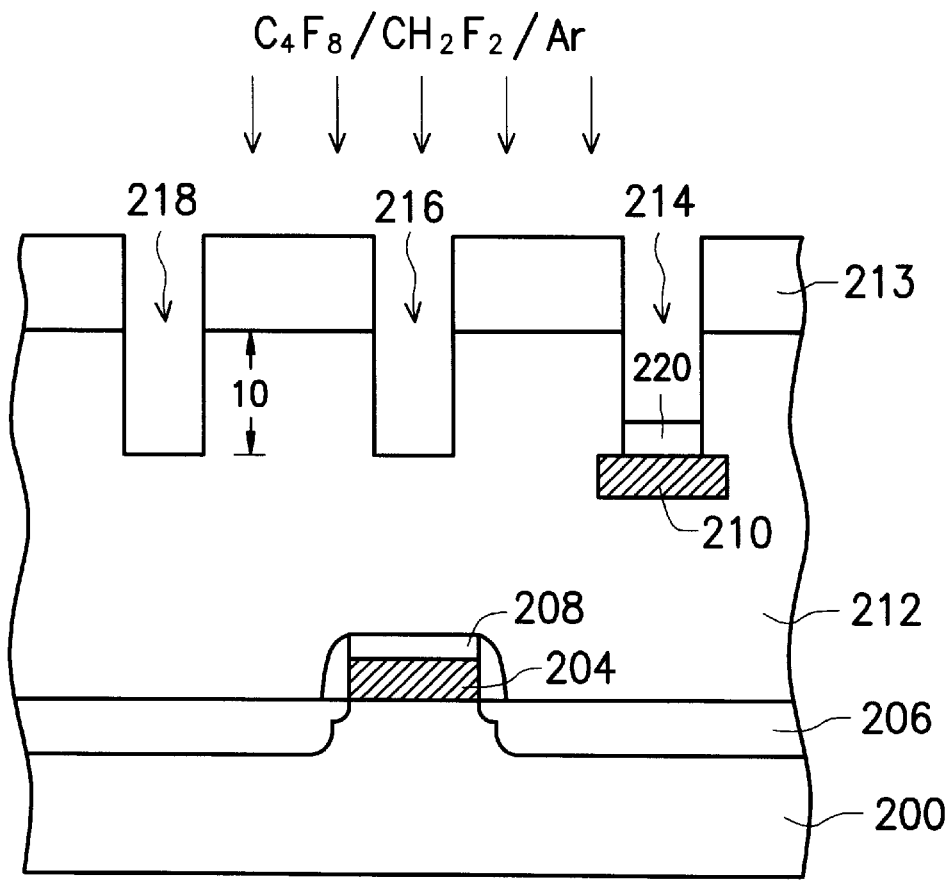
Figure 3:
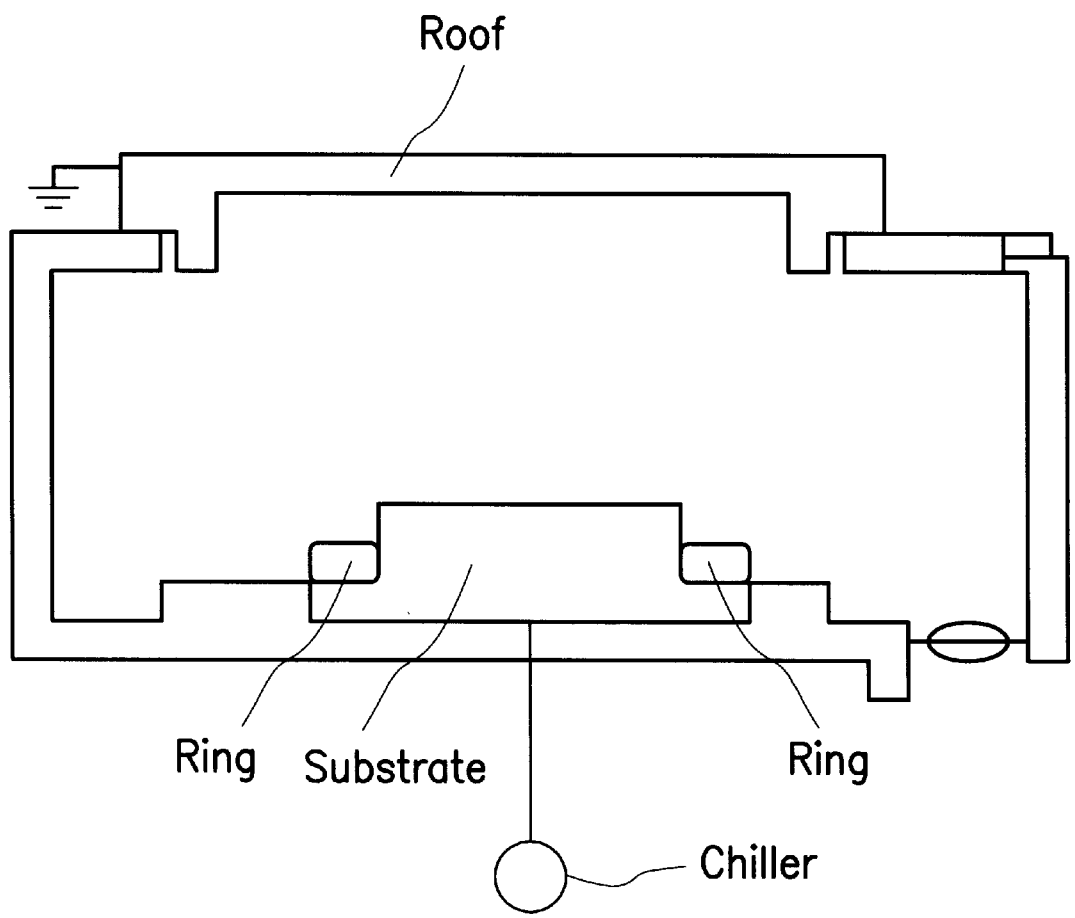
FIG. 3 is a schematic, cross-sectional diagram showing a high density etching system according to the preferred embodiment of the invention.

Referring to FIG. 2B, a patterned photoresist layer 213 is formed on the silicon oxide dielectric layer by a conventional photolithography process. The first stage of an etching process is performed with the photoresist layer 213 serving as an etching mask. The first stage of the etching process is performed on the silicon oxide dielectric layer 212, using the polysilicon layer 210 as an etching stop and a mixture of $C_4H_8$, $CH_2F_2$, and Ar as the etching gas source to form contact openings 214, 216, and 218 having a depth 10. The contact opening 214 exposes the polysilicon layer 210 while the contact openings 216 and 218 are aligned over the gate 204 and the source/drain region 206, respectively. In such mixture, Ar is used to produce bombardment particles, while $C_4H_8$ and $CH_2F_2$ are used to etch silicon oxide dielectric layer 212. It is known that competitive etching reaction comprises an etching reaction and a deposition or polymerization reaction. The competitive etching reaction used as the etching process here. On the polysilicon layer 210, a polymer byproduct 220 is produced with a higher polymerization rate than an etching rate, and therefore, the polymer byproduct 220 remains on the polysilicon layer 210 after the first stage of the etching process. It is noted that the byproduct 220 covering the top of polysilicon layer 210 can protect polysilicon layer 210 in the subsequent etching process. The flow rate of the etching gas source for the first stage is about 10 sccm to 20 sccm for $C_4H_8$, about 1 sccm to 50 sccm for $CH_2F_2$, and about 1 sccm to 500 sccm for Ar, respectively. FIG. 3 illustrates the high density plasma etching system. The first stage of the etching process is performed under a pressure of about 4 mtorr to 100 mtorr, a bias of about 1000 W to 2000 W, a power of about 500 W to 3000 W, a roof temperature about 150° C. to 300° C., a ring temperature of about 150° C. to 400° C., and a chiller temperature of about −20° C. to 20° C.

Figure 2C:
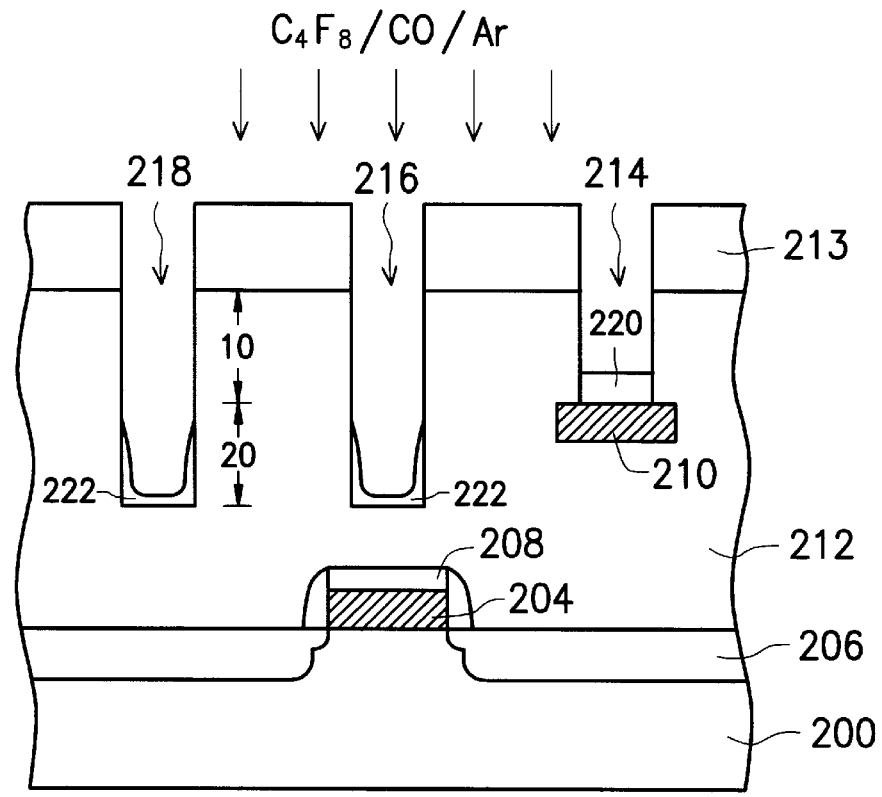

Referring to FIG. 2C, a mixture of $C_4H_8$, CO, and Ar is used as the etching gas source to perform a second stage of the etching process, so that the contact openings 216 and 218 are vertically deepened with a depth 20. In this mixture, Ar is used to produce the bombardment particles, and CO can be used to partially remove a byproduct 222 covering the bottom of the contact openings 216 and 218, so that the underlying silicon oxide dielectric layer 212 below the byproduct 222 is exposed. In addition, $C_4H_8$ also produces an etching reaction with the silicon oxide dielectric layer 212 exposed by the contact openings 216 and 218, resulting in a deeper depth for contact openings 216 and 218. The polymer 222 produced by the competitive reaction of the etching process can assist in shaping the profile of the contact opening, so that the contact opening can be vertically deepened downwards. Moreover, in such etching process, the byproduct 220 covering on the polysilicon layer 210 can protect polysilicon layer 210 from being damaged by etching. The flow rate of each gas in this step is about 10 sccm to 20 sccm for $C_4H_8$, about 1 sccm to 100 sccm for CO, and about 100 sccm to 500 sccm for Ar, respectively. The pressure of the high density plasma etching system is about 4 mtorr to 100 mtorr, the bias is about 1000 W to 2000 W, the power is about 500 W to 3000 W, the roof temperature is about 150° C. to 300° C., the ring temperature is about 150° C. to 400° C., and the chiller temperature is about −20° C. to 20° C.

It is worth mentioning that the above etching process is particularly applicable to forming a contact opening with higher aspect ratio, that is, when the silicon oxide dielectric layer is thicker. For example, after performing the etching process of the first stage, the silicon oxide layer 112 exposed by the openings 216 and 218 still has a thickness of about 10000 to 15000 Å, the depth of the contact openings 216 and 218 can be deepened vertically in the second stage. However, if the remaining thickness of the silicon oxide dielectric layer 212 exposed by the contact openings 216 and 218 is smaller than about 500 Å after the first stage, a third stage of the etching process is followed by skipping the second stage of the etching process.

Figure 2D:
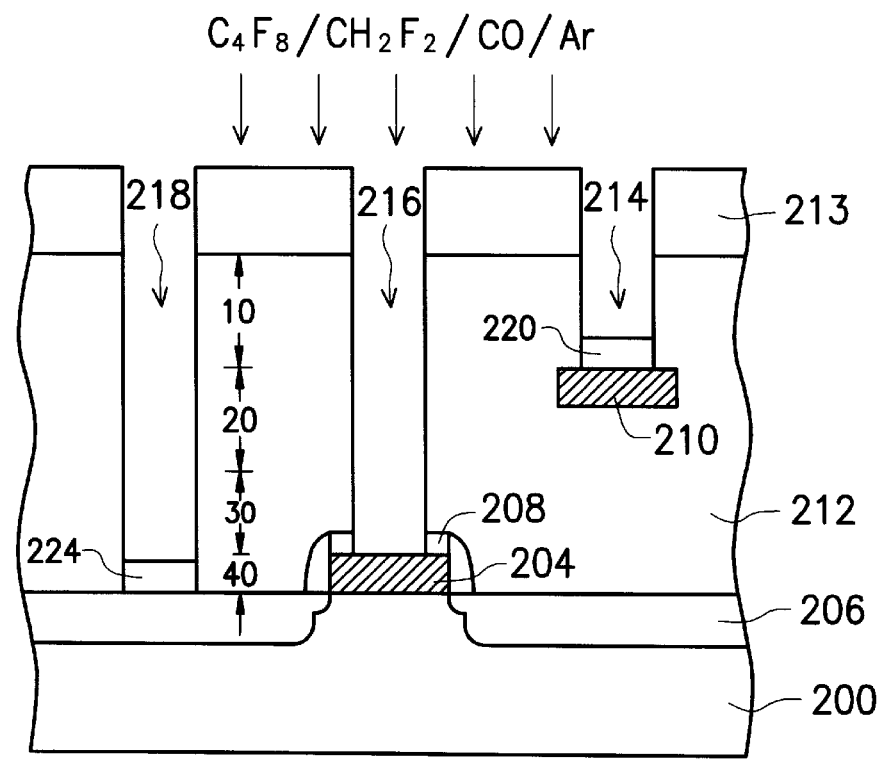

Referring to FIG. 2D, a third stage of the etching process is performed. A mixture of $C_4H_8$, $CH_2F_2$, CO, and Ar is used as the etching gas source in this stage. Contact openings 216 and 218 are deepened downwards until the deepened depth of the contact opening 216 reaches the depth denoted by a reference numeral 30, that is, when the gate 204 is exposed. Meanwhile, the deepened depth of the contact opening 218 reaches a depth denoted by a reference numeral 40 to expose the source/drain region 206. In this mixture, Ar is used to produce bombardment particles, and CO is used to partially remove the byproduct 222 which covers the contact opening 216 and the bottom of contact opening 218 in the second stage, so that the silicon oxide dielectric layer 212 on the bottom is exposed. During the etching process, an etching rate and the polymer polymerization reaction in the whole etching process is adjusted, while $C_4H_8$ and $CH_2F_2$ are used to etch the silicon oxide dielectric layer 212 exposed by a contact opening 216 and the substrate 200 exposed by contact opening 218. In the third stage of the etching process, a low selective etching ratio of silicon oxide to silicon nitride and silicon oxide to silicon-oxy-nitride, and a high etching ratio of silicon oxide to silicide, silicon oxide to polysilicon, or silicon oxide to silicon are chosen. Therefore, in such etching process, once the cap layer 208 on the top of gate 204 is exposed by contact opening 216, the cap layer 208 of silicon nitride or silicon-oxy-nitride can be continuously etched until the gate 204 is exposed. The reaction is then stopped. Once the silicon oxide dielectric layer 212 within the opening 218 is completely removed, a byproduct 224 is formed to cover the source/drain region 206. This prevents the source/drain region 206 from being damaged by etching. Because the contact opening 214 has a protective polymer 220 formed at the first stage, the polysilicon layer 210 is not damaged. The flow rate of the etching gas source at this stage is about 10 sccm to 20 sccm for $C_4H_8$, about 1 sccm to 50 sccm for $CH_2F_2$, about 1 sccm to 100 sccm for CO, and about 1 sccm to 500 sccm for Ar, respectively. Preferably, the conditions for the high density plasma etching system are about 4 mtorr to 100 mtorr for the pressure, about 1000 W to 2000 W for the bias, about 500 W to 3000 W for the power, about 150° C. to 300° C. for the roof temperature, about 150° C. to 400° C. for the ring temperature and about −20° C. to 20° C. for the chiller temperature. A silicon oxide/polysilicon etching ratio of 50:1 can be provided through the above etching process of the invention, so that the etching loss for making the polysilicon layer 210 of the word line is lower than 300 Å.

The residues or byproducts produced by the above etching process can be removed by a washing solution in the subsequent step. The contact openings 214, 216, 218 are then filled with a conductive layer to form metal plugs (not shown).

Therefore, summarized as described above, the etching method of the invention is used to form openings of different depths, and to provide a high selective etching ratio for dielectric layer/gate and dielectric layer/substrate, so that the profile and the depth of the formed opening can be effectively controlled.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An etching method used in a high density plasma etching system to etch a silicon oxide dielectric layer for forming openings of different depth, comprising:

performing a first stage of an etching process on the dielectric silicon oxide layer using a mixture of $C_4H_8$, $CH_2F_2$, and Ar as an etching gas source;

performing a second stage of the etching process on the dielectric layer using a mixture of $C_4H_8$, CO, and Ar as an etching gas source; and performing a third stage of the etching process on the dielectric silicon oxide layer using a mixture of $C_4H_8$, $CH_2F_2$, CO, and Ar as an etching gas source.

2. The etching method of claim 1, wherein the first stage of the etching process is performed under conditions of:

a flow rate of $C_4F_8$ of about 10 sccm to 20 sccm;

a flow rate of $CH_2F_2$ of about 1 sccm to 50 sccm; and a flow rate of Ar of about 1 sccm to 500 sccm.

3. The etching method of claim 2, wherein the first stage of the etching process is performed under conditions of:

a pressure of about 4 mtorr to 100 mtorr;

a bias of about 1000 W to 2000 W;

a power of about 500 W to 3000 W;

a roof temperature of about 150° C. to 300° C.;

a ring temperature of about 150° C. to 400° C.; and a chiller temperature of about −20° C. to 20° C.

4. The etching method of claim 1, wherein the second stage of the etching process is performed under conditions of:

a flow rate of $C_4F_8$ of about 10 sccm to 20 sccm;

a flow rate of CO of about 1 sccm to 100 sccm; and a flow rate of Ar of about 100 sccm to 500 sccm.

5. The etching method of claim 4, wherein the second stage of the etching process is performed under conditions of:

a pressure of about 4 mtorr to 100 mtorr;

a bias of about 1000 W to 2000 W;

a power of about 500 W to 3000 W;

a roof temperature of about 150° C. to 300° C.;

a ring temperature of about 150° C. to 400° C.; and a chiller temperature of about −20° C. to 20° C.

6. The etching method of claim 1, wherein the first stage of the etching process is performed under conditions of:

a flow rate of $C_4F_8$ of about 10 sccm to 20 sccm;

a flow rate of $CH_2F_2$ of about 1 sccm to 50 sccm;

a flow rate of CO of about 1 sccm to 100 sccm; and a flow rate of Ar of about 1 sccm to 500 sccm.

7. The etching method of claim 6, wherein the third stage of the etching process is performed under conditions of:

a pressure of about 10 mtorr to 100 mtorr;

a bias of about 1000 W to 2000 W;

a power of about 500 W to 3000 W;

a roof temperature of about 150° C. to 300° C.;

a ring temperature of about 150° C. to 400° C.; and a chiller temperature of about −20° C. to 20° C.

8. An etching method performed on a silicon oxide dielectric layer in a high density plasma system, wherein the silicon oxide dielectric layer is formed to cover a source/drain region and a gate on a substrate and a polysilicon layer over the substrate, the etching method comprising:

etching the silicon oxide dielectric layer with a mixture of $C_4H_8$, $CH_2F_2$, and Ar as an etching gas source to form a plurality of openings with a first depth using the polysilicon layer as an etching stop, so that the polysilicon layer is exposed by one of the openings, while two of the openings are aligned over the source/drain region and the gate;

deepening the openings to a second depth while the silicon oxide dielectric layer under a bottom of the openings are thicker than about 5000 Å, wherein the silicon oxide dielectric layer is further etched with a mixture of $C_4H_8$, CO and Ar as an etching gas source; and further deepening the openings until the gate and the source/drain region is exposed while the silicon oxide dielectric layer under the bottom of the openings are thinner than about 5000 Å, wherein the silicon oxide dielectric layer is etched with a mixture of $C_4H_8$, $CH_2F_2$, CO and Ar as an etching gas source.

9. The etching method of claim 8, wherein the openings with the first depth are formed under conditions of:

a flow rate of $C_4F_8$ of about 10 sccm to 20 sccm;

a flow rate of $CH_2F_2$ of about 1 sccm to 50 sccm; and a flow rate of Ar of about 1 sccm to 500 sccm.

10. The etching method of claim 9, wherein the openings with the first depth are formed under conditions of:

a pressure of about 4 mtorr to 100 mtorr;

a bias of about 1000 W to 2000 W;

a power of about 500 W to 3000 W;

a roof temperature of about 150° C. to 300° C.;

a ring temperature of about 150° C. to 400° C.; and a chiller temperature of about −20° C. to 20° C.

11. The etching method of claim 8, wherein the openings with the second depth are formed under conditions of:

a flow rate of $C_4F_8$ of about 10 sccm to 20 sccm;

a flow rate of CO of about 1 sccm to 100 sccm; and a flow rate of Ar of about 100 sccm to 500 sccm.

12. The etching method of claim 11, wherein the openings with the first depth are formed under conditions of:

a pressure of about 4 mtorr to 100 mtorr;

a bias of about 1000 W to 2000 W;

a power of about 500 W to 3000 W;

a roof temperature of about 150° C. to 300° C.;

a ring temperature of about 150° C. to 400° C.; and a chiller temperature of about −20° C. to 20° C.

13. The etching method of claim 8, wherein the openings are further deepened under conditions of:

a flow rate of $C_4F_8$ of about 10 sccm to 20 sccm;

a flow rate of $CH_2F_2$ of about 1 sccm to 50 sccm;

a flow rate of CO of about 1 sccm to 100 sccm; and a flow rate of Ar of about 1 sccm to 100 sccm.

14. The etching method of claim 13, wherein the openings are further deepened under conditions of:

a pressure of about 10 mtorr to 100 mtorr;

a bias of about 1000 W to 2000 W;

a power of about 500 W to 3000 W;

a roof temperature of about 150° C. to 300° C.;

a ring temperature of about 150° C. to 400° C.; and a chiller temperature of about −20° C. to 20° C.

15. The etching method according to claim 8, wherein the gate is covered by a cap layer which is removed while the openings are further deepened.

16. The etching method according to claim 8, wherein a byproduct is formed to cover the polysilicon layer while the openings are formed with the first depth to expose the polysilicon layer.

* * * * *